US006417245B1

(12) United States Patent
Fowler et al.

(10) Patent No.: US 6,417,245 B1
(45) Date of Patent: Jul. 9, 2002

(54) METHOD FOR THE PREPARATION OF CONJUGATED POLYMERS

(75) Inventors: Frank W. Fowler, Bellport; Joseph W. Lauher, South Setauket, both of NY (US); Jun Xiao, New London, CT (US); Meng Yang, Clark, NJ (US)

(73) Assignee: The Research Foundation of State University of NY, Stony Brook, NY (US)

( * ) Notice: Subject to any disclaimer, the term of this patent is extended or adjusted under 35 U.S.C. 154(b) by 0 days.

(21) Appl. No.: 09/620,509

(22) Filed: Jul. 20, 2000

(51) Int. Cl.[7] .................................................. C08F 2/46
(52) U.S. Cl. ...................... 522/186; 522/184; 522/157; 522/158; 522/150; 526/285; 526/335; 526/72
(58) Field of Search .............................. 526/285, 335, 526/72; 522/157, 158, 162, 150, 149, 184, 186

(56) References Cited

U.S. PATENT DOCUMENTS

| 4,615,962 A | * | 10/1986 | Garito ......................... 430/20 |
| 4,703,096 A | * | 10/1987 | Choe .......................... 526/248 |
| 5,002,707 A | * | 3/1991 | Ogawa et al. ................. 264/22 |
| 5,408,109 A | * | 4/1995 | Heeger et al. ................ 254/40 |
| 5,777,292 A | * | 7/1998 | Grigorov et al. ...... 204/157.15 |
| 5,869,350 A | * | 2/1999 | Heeger et al. ................ 438/29 |

OTHER PUBLICATIONS

Salcedo et al. Theoretical simulation of the topchemical polymerization of some diacetylene molecules. Polymer, 37(9), 1996, pp. 1703–1708.*

Feast et al. Synthesis, processing and material properties of conjugated polyemrs. Polymer 37 (22) 1996, pp. 5017–5047.*

Enkelmann, V., "Solid–State Reactivity of Triacetylenes," Chem. Mater., vol. 6, No. 8, pp. 1337–1340 (1994).

Enkelmann, V., Structural Aspects of the Topochemical Polymerization of Diacetylenes, *Advances in Polymer Science* (1984).

Xiao, et al., "A Supramolecular Solution to a Long–Standing Problem: The 1,6–Polymerization of a Triacetylene," *Angew. Chem. Int. Ed.*, 39, No. 12 (2000).

Kane, et al., "Preparation of Layered Diacetylenes as a Demonstration of Strategies for Supramolecular Synthesis," *J. Am. Chem. Soc.*, 117, 12003–12004 (1995).

* cited by examiner

*Primary Examiner*—James J. Seidleck
*Assistant Examiner*—Sanza L. McClendon
(74) *Attorney, Agent, or Firm*—Hoffmann & Baron, LLP

(57) ABSTRACT

A method of preparing a conjugated polymer which includes: determining a first intermolecular repeat distance and a first tilt angle relative to the translation axis for a guest molecule having a first atom and a second atom; selecting a host molecule having a second intermolecular repeat distance and a second tilt angle relative to the translation axis; synthesizing the host molecule and the guest molecule to form a co-crystal, wherein the first and the second repeat distances and the first and the second tilt angles are about equal so that when said host molecule and said guest molecule are synthesized the first atom and the second atom of adjacent guest molecules are in near van der Waals contact; and polymerizing the co-crystals to form the conjugated polymer. In a preferred embodiment, the guest molecule is a polytriacetylene and the host molecule has an intermolecular repeat distance of from about 6.0 Å to about 8.5 Å and a tilt angle of from about 23° to about 32° and the conjugated polymer is a polytriacetylene.

24 Claims, 10 Drawing Sheets

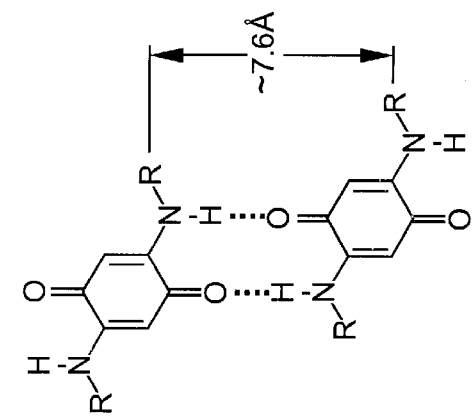
FIG. 5A ISOCYTOCINES ~6.6Å
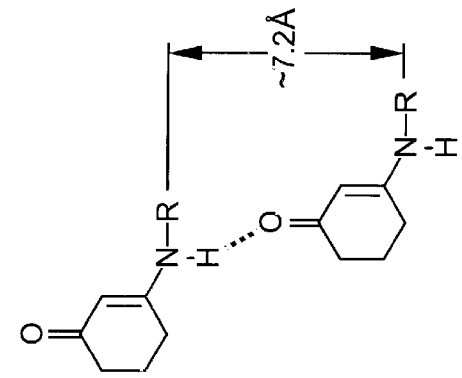
FIG. 5B AMINOPYRIDONES ~6.7Å
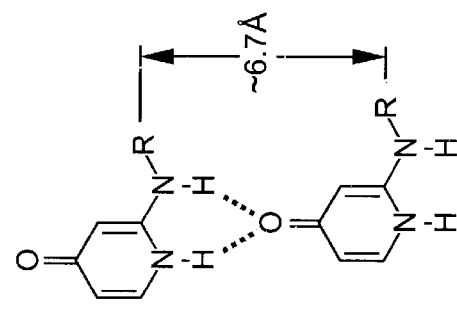
FIG. 5C VINYLOGOUS AMIDES ~7.2Å
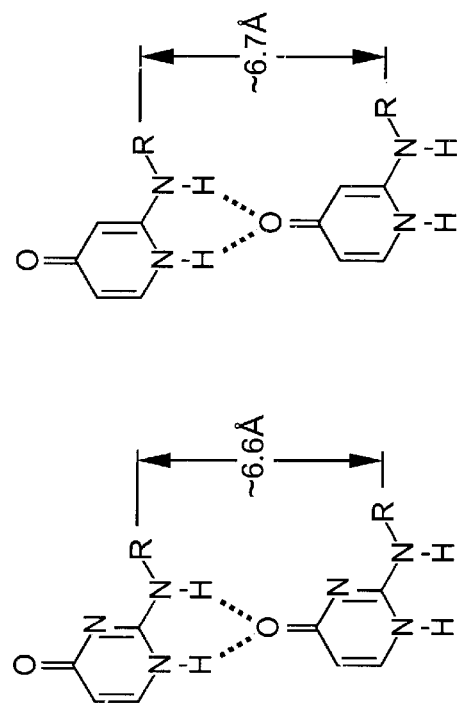
FIG. 5D AMINOQUINONES ~7.6Å

METHOD FOR THE PREPARATION OF CONJUGATED POLYMERS

This invention was made with Government support under Grant No. CHE9630042 awarded by the National Science Foundation. The Government has certain rights in the invention.

BACKGROUND OF INVENTION

The present invention relates to a method for the preparation of conjugated polymers. In particular, the present invention relates to a method for the topochemical polymerization of two molecules using the supramolecular characteristics of the molecules to design molecular structures from conjugated monomers having greater than two unsaturated bonds.

Supramolecular chemistry is one of the most rapidly developing fields of science due to the importance of intermolecular interactions, structure, and cooperativity in molecular science and many related technological fields, including biology, pharmacology and materials science. Supramolecular chemistry is often referred to as the chemistry of the non-covalent bond. The forces involved in non-covalent bonds are relatively weak, non-directional and occur over the entire van der Waals surface of a molecule. The preparation of a supramolecular structure requires controlling these weak, non-directional forces in three dimensions. This is a formidable problem beyond current abilities, since it is generally not possible to even predict the solid state structure of a given molecule.

The physical and chemical properties of a molecular solid depend directly upon the relative orientations and spacings of the constituent molecules. In order to produce synthetic forms of a solid, it is necessary to duplicate the relative orientations and spacings. The duplication of the relative orientations and spacings of complex crystal structures poses numerous problems. Attempts have been made to approach the problem by combining methods of traditional molecular synthesis with the techniques of supramolecular synthesis. However, these attempts have been mostly unsuccessful because a method has not been found to control the molecular orientations and spacings in a crystal to produce a synthetic form of a solid.

Substituted ureas and vinylogous ureas have been used to prepare a variety of layered organic crystals. The urea functionality consistently forms one-dimensional hydrogen-bonded α-networks via hydrogen bonds between the carbonyl of one urea and the anti-hydrogen atoms of the nitrogen atoms of a neighboring urea. The α- and β-networks are supramolecular structural features possessing translational symmetry in one and two directions, respectively. These networks, together with discrete assemblies and γ-networks, represent the four fundamental supramolecular structures.

Supramolecular structures are discussed in detail in an article titled, *An Approach to the Design of Molecular Solids. The Ureylene Dicarboxylic Acids* by X. Zhao, Y. L. Chang, F. W. Fowler and J. W. Lauher, *Journal of the American Chemical Society*, 1990, 112, 6627, which is incorporated herein by reference in its entirety. If substituents, such as carboxylic acid functionalities, are added to the urea, the one-dimensional α-networks can be brought together to form a two-dimensional β-network. By choosing the appropriate molecule, the spacings and symmetry of the hydrogen-bonded β-networks that define these layers can be controlled.

Polyacetylenes

The families of polymers derived from acetylene and its oligomers have been widely explored for the development of advanced materials. Polyacetylenes can be prepared by the polymerization of alkynes in solution to form a series of acetylenes, which includes polyacetylene, polydiacetylene and polytriacetylene. FIGS. 3a, 3b and 3c show the structures of polyacetylene, polydiacetylene and polytriacetylene, respectively. Until now, only the first and second members of this series (polyacetylene and polydiacetylene) have been prepared by direct polymerization of the monomer. The polydiacetylenes can only be prepared by the topochemical polymerization of diacetylenes in a condensed phase. The third member of this series, polytriacetylene, has not been successfully polymerized to produce a polytriacetylene.

Diacetylenes

Polydiacetylenes have been formed by a unique synthesis via topochemical polymerization of diacetylenes in a condensed matter state. It has been found that polymerization occurs when the monomer molecules are properly aligned at a critical repeat distance (d) of approximately 5.0 Å and with an orientation angle ($\phi$) of about 45° relative to the translation axis. For such a 1–4 polymerization to take place, the monomer molecules must meet stringent structural requirements, so that the $C_1$ and $C_4$ carbons of neighboring monomers are in close intermolecular contact. However, most diacetylenes do not crystallize properly and most do not polymerize at all in the solid state because there is little that can be done to influence the crystal structure of a single molecule.

The topochemical requirements for the polymerization of diacetylenes are disclosed by V. Enkelmann in *Structural Aspects of the Topochemical Polymerization of Diacetylenes*, Advanced Polymer Science, 1984, 63, 91–136. This reference is incorporated herein in its entirety. Enkelmann discloses an intermolecular repeat distance, d, of approximately 4.9 Å and a tilt angle, $\phi$, of approximately 44° from the axis brings the 1–4 carbons of adjacent diacetylenes into near van der Waals contact. A diacetylene that meets these structural requirements can be expected to undergo topochemical polymerization upon radiation or heat exposure. The difficulty is that most diacetylenes do not meet these structural requirements upon crystallization. Accordingly, only a few diacetylenes polymerize to produce polydiacetylenes

Polytriacetylenes

Polytriacetylenes are a new class of conjugated polymer networks that are derived from polyacetylene and polydiacetylene. Oligomers of this polymer have been formed, not by the direct polymerization of a triacetylene, but only by indirect means. The polytriacetylene oligomers have attractive electrical and optical properties and they appear to be more stable than either the polyacetylenes or the polydiacetylenes. Stability is an important property since the instability of polyacetylenes is one of the primary reasons that this class of conjugated polymers has resisted commercial development.

The obstacles that must be overcome for triacetylene polymerizations are even more challenging than those encountered in diacetylene polymerizations. Polytriacetylene oligomers have been prepared by indirect means but not by polymerization of a triacetylene. Significantly, polytriacetylene oligomers appear to be more stable than either the polyacetylenes or polydiacetylenes. Previous attempts to polymerize triacetylenes have not resulted in the reporting of a successful example of this transformation.

Attempts to form conjugated polymers, such as polytriacetylene, have been mostly unsuccessful because most complex polymers, such as triacetylene, do not crystallize properly and most do not polymerize at all in the solid state. The present invention has overcome these problems by developing a strategy that takes advantage of supramolecular characteristics of different molecules to design and build co-crystal structures, which can be polymerized to form conjugated polymers.

SUMMARY OF THE INVENTION

The present invention is a method for the preparation of a conjugated polymer from a conjugated monomer that is not directly polymerizable. In one embodiment, the conjugated monomer has greater than two unsaturated bonds. The method includes complexing a stable host molecule and a guest conjugated monomer having greater than two unsaturated bonds to form a co-crystal. The complexing fixes the conjugated monomer such that when a plurality of the co-crystals are polymerized, reactive atoms of adjacent monomers are brought into near van der Waals contact to each other. After the co-crystals are formed, they are polymerized to form a conjugated polymer. In one embodiment of the present invention, the method includes determining a first intermolecular repeat distance and a first tilt angle relative to the translation axis for the guest conjugated monomer prior to complexing with the host molecule. In another embodiment, the host molecule has a second intermolecular repeat distance and a second tilt angle relative to the translation axis, and the guest conjugated molecule is selected so that the first and the second repeat distances and the first and the second tilt angles are substantially equal.

The preferred method of polymerizing the co-crystals is topochemical polymerization, which is preferably carried out using gamma radiation. Preferably, at least fifty percent of the co-crystals are converted to a conjugated polymer when the co-crystals are polymerized and most preferably at least seventy percent of the co-crystals are converted.

In a preferred embodiment of the present invention, polytriacetylene is prepared by complexing a stable host molecule and guest triacetylene molecule to form a co-crystal. The complexing fixes the triacetylene molecule so that when a plurality of the co-crystals are polymerized, reactive atoms of adjacent triacetylene molecules are brought into near van der Waals contact to each other, preferably within about 3.5 Å. The co-crystals are then polymerized to form polytriacetylene. It has been found that the preferred reactive atoms of the adjacent triacetylene molecules, which are brought into near van der Waals contact, are the $C_1$ and $C_6$ atoms. The triacetylene molecules have a first intermolecular repeat distance of about 7.5 Å and a first tilt angle relative to the translation axis of about 27°. In a preferred embodiment, a host molecule is selected which has a second intermolecular repeat distance, preferably from about 7.1 Å to about 7.6 Å, and a second tilt angle relative to the translation axis, preferably from about 23° to about 32°, so that the first and the second repeat distances and the first and the second tilt angles are substantially equal. The preferred host molecules are isocytocine, aminopyridone, vinylogous amide and diaminobenzoquinone.

The present invention provides a method of producing conjugated polymers, such as polytriacetylenes, which possess valuable optical and electrical properties useful for the development of advanced materials.

BRIEF DESCRIPTION OF THE FIGURES

Other objects and many attendant features of this invention will be readily appreciated as the invention becomes better understood by reference to the following detailed description when considered in connection with the accompanying drawings wherein:

FIG. 5a shows the structure of an isocytocine molecule having a repeat distance of about 6.6 Å.

FIG. 5b shows the structure of an aminopyridone molecule having a repeat distance of about 6.7 Å.

FIG. 5c shows the structure of a vinylogous amide molecule having a repeat distance of about 7.2 Å.

FIG. 5d shows the structure of a diaminobenzoquinone molecule having a repeat distance of about 7.6 Å.

DETAILED DESCRIPTION OF THE INVENTION

Figure 1A:
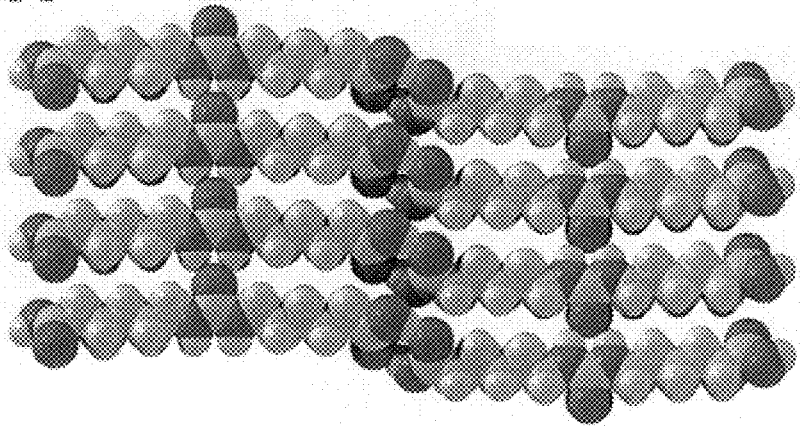
FIG. 1a is the β-network formed by the urea of 6-aminohexanoic acid.

The present invention is a method for the preparation of certain conjugated polymers by using designed supramolecular structures. The method applies strategies used for the supramolecular synthesis of specific layered structures to the field of solid state reactions to form conjugated polymers having superior electrical and optical properties. Using this method, supramolecular structures can be formed for specific functions and applications.

The present invention relies on designed supramolecular structures using a method which combines synthetic chemistry and an area of chemistry where noncovalent bonds play an important role in determining the structures of the synthetic materials. Although there are parallels to traditional molecular syntheses, there are also significant differences. Not only do the specific intermolecular interactions between two molecules have to be considered, such as a hydrogen bond, but the design must also consider how the interaction affects further interactions of these two molecules with neighboring molecules. In the crystalline state, this is crystallography. Thus, for a successful preparation of a designed supramolecular structure, both good chemistry (hydrogen bonds, steric effects, etc.) and good crystallography (structures must conform to crystallographic symmetry, inversion, translation, glide planes, etc) must exist.

The development of strategies for the preparation of designed supramolecular structures requires knowledge of intermolecular interactions. Extensive work in this field has provided a large body of information on molecular structures and intermolecular interactions. This information is used in strategies for the preparation of designed supramolecular structures to select materials, which are compatible as host molecules and guest molecules, and which will associate in the solid state. The role of the host molecule is to provide the desired molecular scaffold and the role of the guest molecule is to provide the functional group of interest. After the host and guest molecules have been selected, molecular synthesis is used to prepare supramolecular structures. Structural chemistry is then used to analyze the structures and determine if the predicted supramolecular structures have been successfully formed. Thus, the present invention is based in neither synthetic nor structural chemistry but employs a combination of the two that is referred to herein as supramolecular synthesis.

Designed supramolecular structures are prepared by controlling certain parameters of the supramolecular structure, such as molecular spacing in one or two dimensions. The development of advanced materials does not require the control of all of the aspects of the supramolecular structure, only the control of specific supramolecular features. It has been found that the supramolecular synthesis of a designed structure can be accomplished by controlling the critical repeat distance and the orientation angle relative to the translation axis. In this way, the location of specific atoms can be controlled in order to form heretofore-unknown polymerizable structures.

The present invention employs a host-guest co-crystal approach to prepare conjugated polymers. This strategy requires the design of two different molecules which together contain the components needed for the self-assembly of a desired network. One molecule serves as the host and is used to control the structure, i.e., the critical intermolecular spacing. The second molecule, the guest molecule, provides the desired function, i.e., a monomeric unit for a solid state polymerization reaction. Host and guest molecules are selected which have an appropriate set of matched substituents to assure a strong intermolecular interaction between the molecules. Not only must the host and guest molecules be structurally compatible, but they must also be chemically compatible. When the host and guest molecules are synthesized, the intermolecular interactions can be used by the host to assemble the guest. In a preferred design, the strong pyridinecarboxylic acid hydrogen bond is used to direct this important intermolecular association. The host-host and host-guest interactions usually remain orthogonal and designed structures can be prepared with a reasonable degree of certainty.

After the host and guest molecules are synthesized to form a co-crystal, they are polymerized by topochemical polymerization. Successful topochemical polymerization requires the proper alignment of the molecules at a critical repeat distance and with a specific orientation angle relative to the translation axis. Topochemical polymerization is a polymerization reaction, which is not expressible in stoichiometric relationships. The chemical reactions in a topochemical polymerization can take place only at certain sites on the molecular structure where reactive groups are available, i.e., in the amorphous areas or on the surfaces of the crystalline areas. Therefore, the host molecule must be selected so that when it is combined with the guest molecule, selected atoms will be positioned to provide the required topochemical conditions for polymerization.

The initial step in the present method is the identification of molecular functionalities, which reliably yield networks with predictable intermolecular distances. In order to illustrate the concept, simple amides are considered. Amides form one-dimensional α-networks. The repeat distance can vary from about 4.6 Å to 5.1 Å depending on the position of the hydrogen atom above the oxygen of the carbonyl. The repeat is shorter if the hydrogen approaches the classic "lone pair" position, longer if it takes a position co-linear with the carbonyl. Amides also have a free torsion angle about their hydrogen bond leading to a range of possible structures, with no obvious predictability. Thus, a simple amide will always form a hydrogen bond, but one with a considerable amount of structural freedom and structural uncertainty. Furthermore in the presence of other functional groups, a simple amide is not reliably self complementary.

In order to assure more structural certainty, amides that form two hydrogen bonds to each neighbor, a more specific interaction, are considered. Two such groups are the urea and oxalamide functionalities. The two hydrogen bonds "lock in" predictable distances and eliminate the free torsion angle of a simple amide. In addition, the crystallographic symmetry is reproducible, symmetrical ureas tend to have a two-fold axis; oxalamides, an inversion center. It has been found that side substituents with additional hydrogen bond capability can be added to either of these functional groups to reliably form layered structures.

Figure 1B:
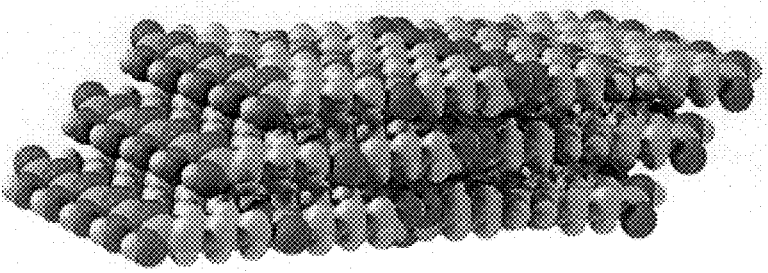
FIG. 1b is an edge view of the β-network formed by the urea of 6-aminohexanoic acid.
Figure 1C:
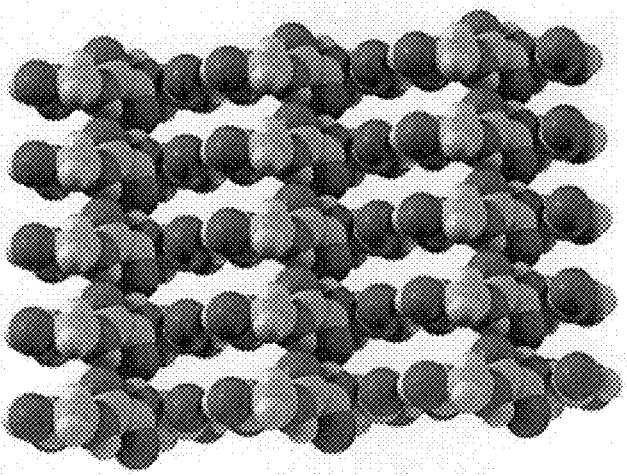
FIG. 1c is the β-network formed by the oxalamide of glycine.

Ureas or oxalamides derived from various amino acids or short peptides form hydrogen bonds in a second direction via complementary carboxylic acid groups. They yield layered structures in which one dimension is controlled by the urea or oxalamide repeat while the second dimension is controlled by the length of the side chain. In addition to carboxylic acids, terminal amides, alcohols and phenols can be used to control the second dimension of the networks. Examples of such structures are shown in FIGS. 1a, 1b and 1c. The β-network formed by the urea of 6-aminohexanoic acid is shown in FIG. 1a. An edge view of this same material is shown in FIG. 1b. The oxalamide of glycine also forms a β-network as shown in FIG. 1c. The spacing of the urea layer is 4.65 Å and the spacing for the oxalamide structure is approximately 5.0 Å.

Host-Guest/Co-crystal Approach

One approach to the formation of supermolecular structures is based on single molecules that form selfcomplimentary hydrogen bonds in the solid state. The problem with this approach is that it is difficult to combine features needed to control a supramolecular structure with structural features needed for function into one molecule. The design of such a sophisticated molecule requires a complex molecular synthesis. After the molecule has been synthesized, it is allowed to self-assemble. An analysis of the formed molecules then determines whether or not the desired supramolecular structure was successfully formed. If the desired structure was not formed, the design of the supramolecular structure of the single molecule is altered and the synthesis repeated for another "one shot" experiment. This linear approach is tedious and not very efficient.

A binary system using two molecules to prepare a desired supramolecular structure is an attractive alternative. In a binary system, one molecule serves as a host and provides the functionality necessary for the controlling the supramolecular structure. The host is selected to control the intermolecular spacing and the orientation angle relative to the translation axis. A second molecule provides the functionality with the property of interest, such as a photochemical chromophore, a magnetic center, or a monomeric unit for a solid state polymerization reaction. For the approach to work, the two molecules must form a favorable host-guest complex. This requires a predictable and reliable intermolecular interaction between the two molecules.

The great advantage of the binary approach is that it is convergent at the supramolecular step so that a combinatorial approach can be used for supramolecular synthesis. As described in detail herein, an oxalamide host gives a suitable intermolecular spacing when used in the crystal to crystal polymerization of polydiacetylene. If a diacetylene guest is prepared, the compound can be co-crystallized with any of hundreds of easily synthesized oxalamide hosts. Each oxalamide host delivers a similar, yet subtly different guest environment. This provides a method to fine-tune the desired polymerization.

Figure 2A:
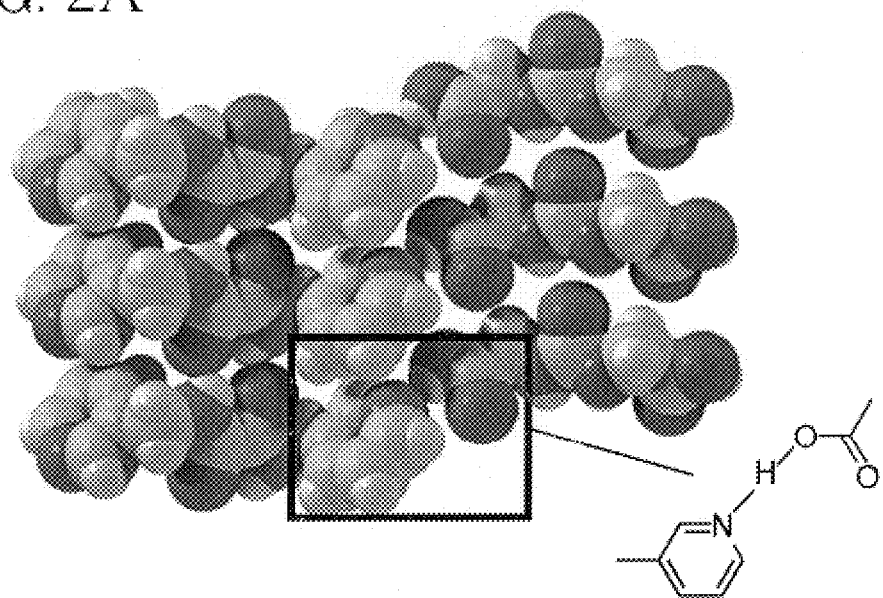
FIG. 2a is a binary crystal where the molecules interact via a carboxylic acid pyridine hydrogen bond.
Figure 2B:
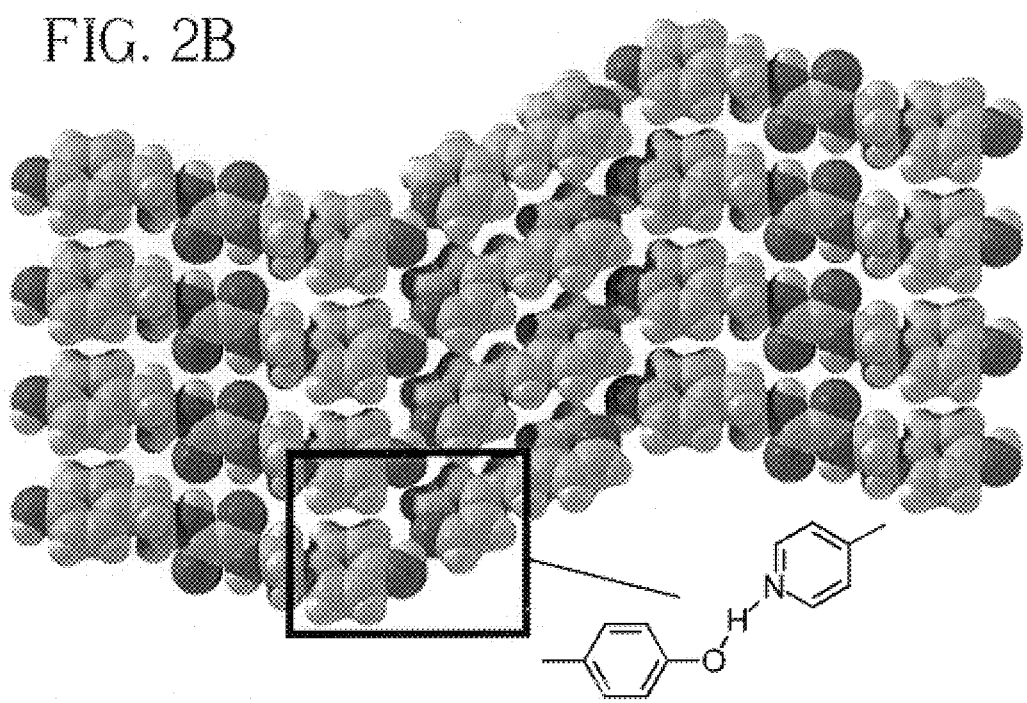
FIG. 2b is a binary crystal where the molecules interact via a phenol-pyridine hydrogen bond.
Figure 3A:
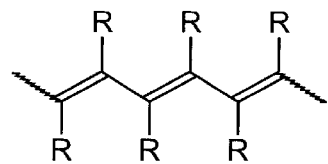
FIG. 3a is the structure of an acetylene molecule.
Figure 3B:
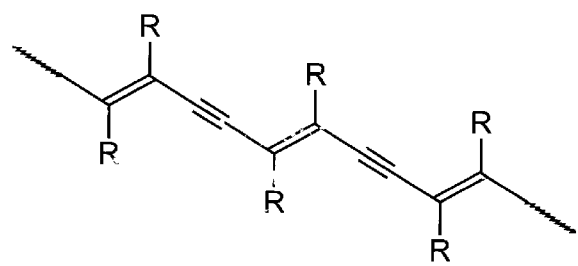
FIG. 3b is the structure of a diacetylene molecule.
Figure 3C:
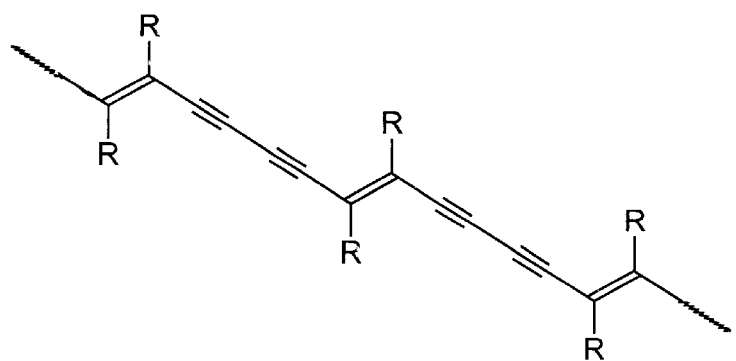
FIG. 3c is the structure of a triacetylene molecule.
Figure 4A:
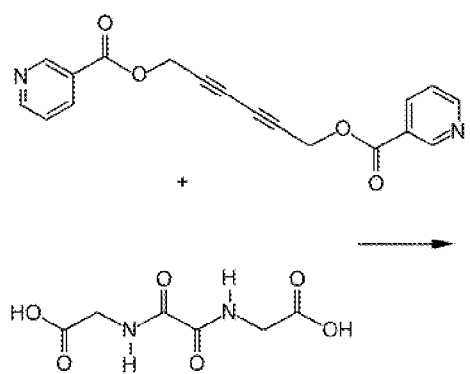
FIG. 4a shows the structure of an oxamide host molecule and a diacetylene guest molecule.
Figure 4B:
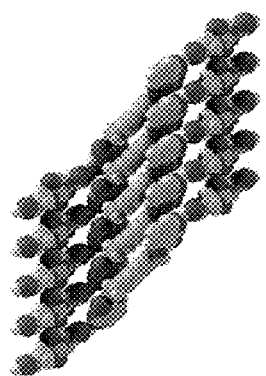
FIG. 4b shows the crystal structure of the host-guest compound formed by an oxamide host molecule and a diacetylene guest molecule.
Figure 4C:
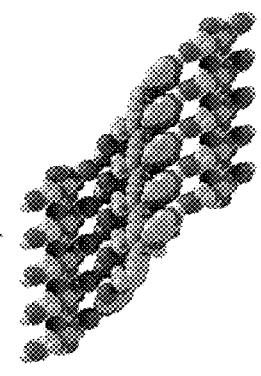
FIG. 4c shows the crystal structure of the polydiacetylene formed by topochemical polymerization of the host-guest compound formed by an oxamide host molecule and a diacetylene guest molecule.

For the co-crystal strategy to be successful, the kinetics and/or thermodynamics for assembling the host and guest molecules into a co-crystal structure must be more favorable than assembling the individual molecules into a solid. Otherwise, the molecules will crystallize separately. The simplest interactions of this type are acid-base interactions. The pyridine-carboxylic acid hydrogen bond has proven to be very useful. It is relatively strong and has been used for molecular organization of liquid crystals and polymers. Using the present invention, a large number of co-crystals have been prepared based upon this strategy. FIGS. 2a and 2b illustrate two examples of binary crystals. In FIG. 2a, the molecules interact via a carboxylic acid pyridine hydrogen bond, while in FIG. 2b, the molecules interact via a phenol-pyridine hydrogen bond. In order for the host-guest method of the present invention to operate successfully, the intermolecular interactions between the host and guest molecules must be predictable and reliable.

It has been found that some less conventional alkyne interact with pyridines. The alkyne sp CH bond is relatively acidic and seems to form C—H hydrogen bonds in a reliable manner. Also, it has been discovered that bromo alkynes form persistent and reliable intermolecular interactions with pyridines and crystal structures of eight different examples have been determined.

In the case of triacetylenes, for example, all attempts of direct polymerization reported to date have been unsuccessful. Enkelmann has calculated that a triacetylene requires a molecular repeat distance (d) of about 7.5 Å with a 27° angle from the translation direction for a successful topochemical polymerization. (See Enkelmann, B., *Solid-State Reactivity of Triacetylenes*, J. Mater. Chem., 1994, 6, 1337–1340, which is incorporated herein by reference in its entirety.) These structural parameters bring $C_1$ and $C_6$ to within the necessary van der Waals contact. The repeat distance and tilt angle have been found to vary to some degree due to the interaction between the host molecule and the triacetylene guest molecule. In previous attempts to prepare polytriacetylene, and other polyacetylenes, the primary problem encountered was the inability to properly orient the carbon atoms of the acetylene for polymerization. This problem is particularly critical for polymerization of tri-acetylenes because it is improbable that random triacetylenes will possess the repeat distance of about 7.5 Å necessary for a 1–6 polymerization.

In a preferred embodiment of the present invention, a method is provided for properly orienting triacetylenes for a topochemically-controlled polymerization using a host-guest strategy. The method includes the synthesis of a hydrogen-bonded host selected from the vinylogous amides and diaminobenzoquinones and the preparation of one or more triacetylenes with the proper functionalities to behave as guests. Vinylogous amides and diaminobenzoquinones were selected as the preferred hosts after considering several molecules. FIGS. 5a to 5d show four different structures, which were considered as hosts for triacetylene polymerization using the host-guest method of the present invention. The isocytocines and aminopyridones shown in FIGS. 5a and 5b possess attractive properties, but their application work was limited by the few methods available for their preparation and their relatively short molecular repeat distances (about 6.6 Å for isocytocines and about 6.7 Å for aminopyridones). The vinylogous amides (FIG. 5c) and diaminobenzoquinones (FIG. 5d) have longer repeat distances of about 7.2 Å and about 7.6 Å, respectively, which are closer to the theoretical repeat distances predicted by Enkelmann.

Figure 6A:
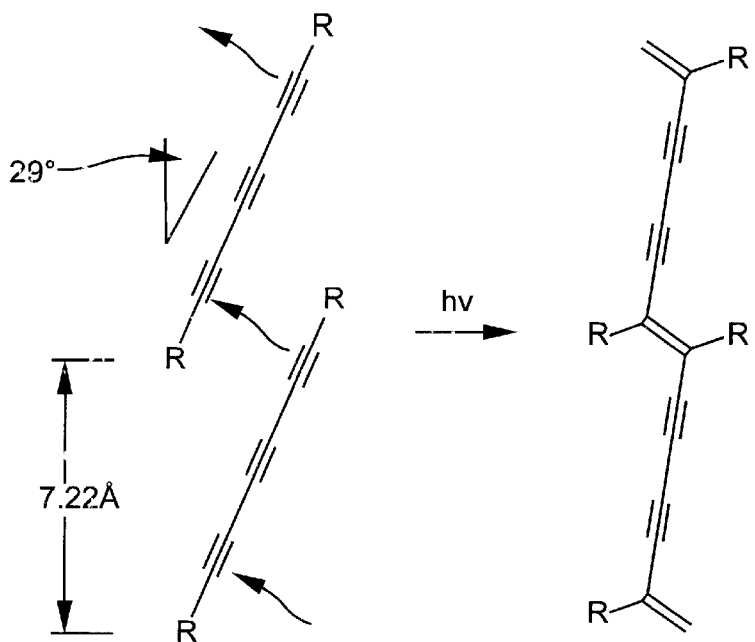
FIG. 6a shows the 1–6 polymerization of two triacetylene molecules.
Figure 6B:
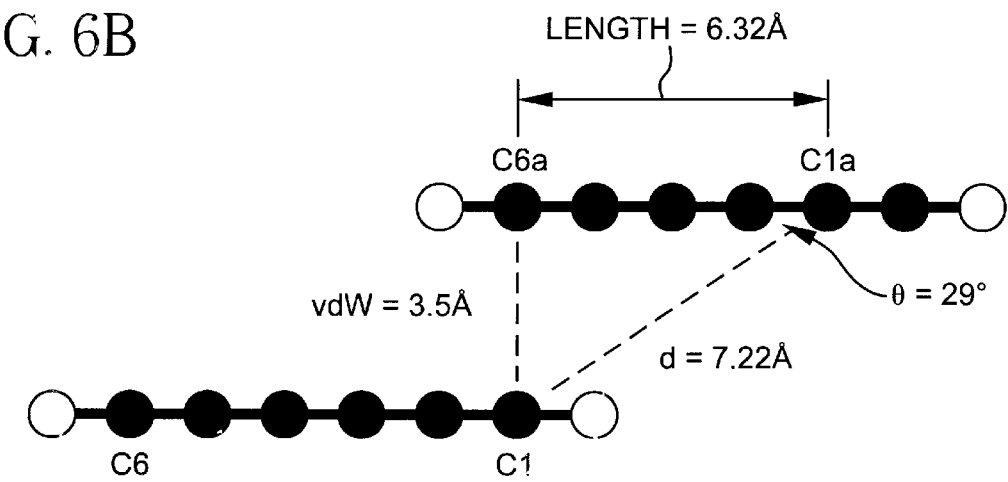
FIG. 6b shows the van der Waals contact distance and the tilt angle for the 1–6 polymerization of two triacetylene molecules.
Figure 7A:
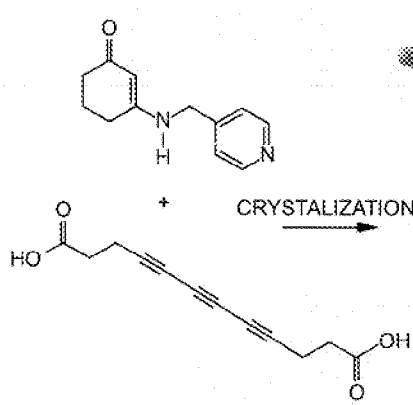
FIG. 7a shows the structure of a vinylogous amide host molecule and a triacetylene guest molecule.
Figure 7B:
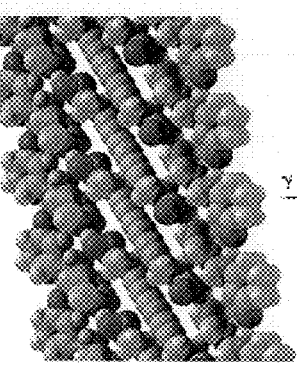
FIG. 7b shows the crystal structure of the host-guest compound formed by a vinylogous amide host molecule and a triacetylene guest molecule.
Figure 7C:
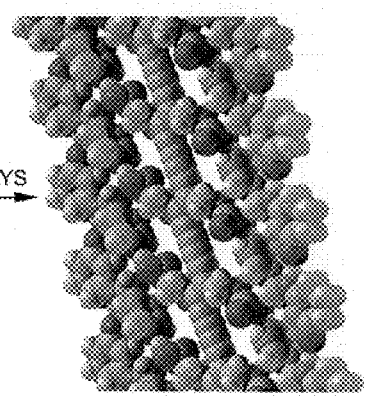
FIG. 7c shows the crystal structure of the polytriacetylene formed by topochemical polymerization of the host-guest compound formed by a vinylogous amide host. molecule and a triacetylene guest molecule.
Figure 7D:
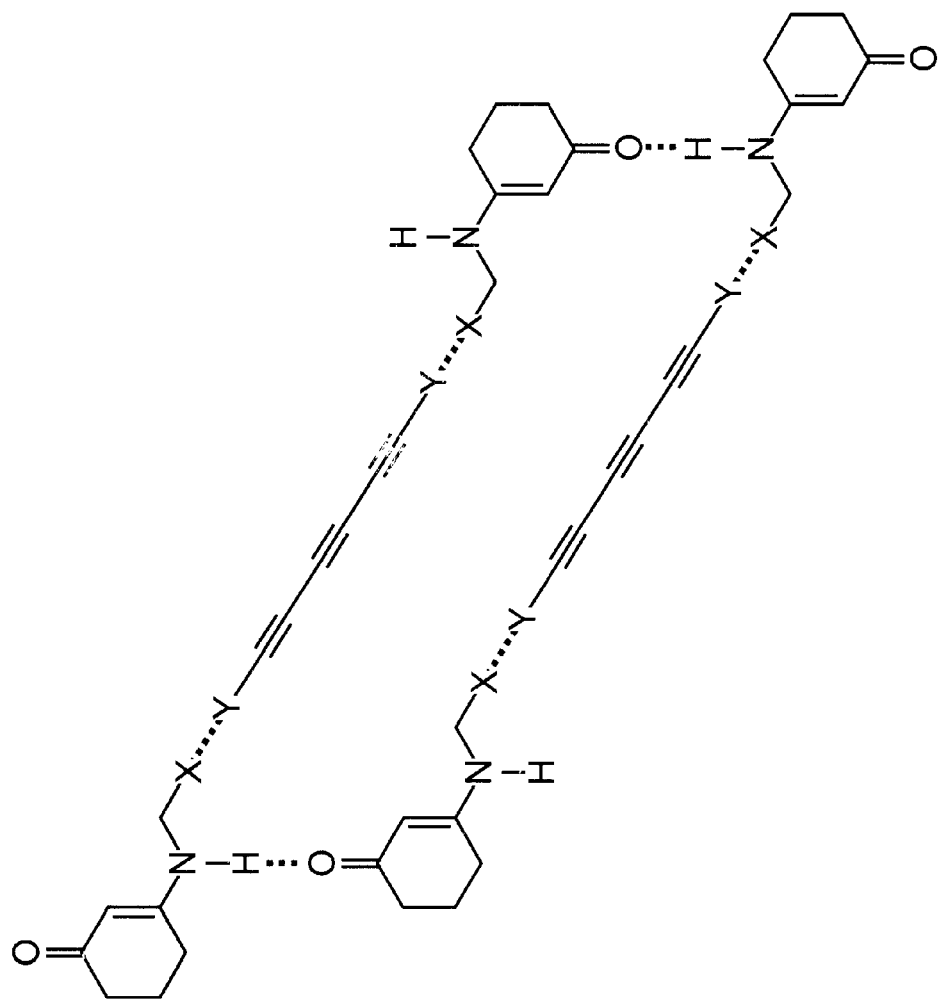
FIG. 7d shows the functional structure of the polytriacetylene formed by topochemical polymerization of the host-guest compound formed by a vinylogous amide host molecule and a triacetylene guest molecule.

A triacetylene will polymerize only if it is preorganized in a precisely defined geometry that brings the $C_1$ carbon of one triacetylene molecule into van deer Waals contact with the $C_6$ carbon of the adjacent triacetylene molecule. As shown in FIG. 6a, equivalent atoms (i.e., for example, the $C_1$ atom in adjacent triacetylene molecules) must be translationally related by a distance of about 7.2 Å. Also, the triacetylene monomers must adopt an angle of 29° with respect to the translational axis between the two molecules. The values are derived based upon known bond distances and an assumed 3.5 Å van der Waals contact (i.e., the distance between the $C_1$ and $C_6$ atoms of adjacent triacetylene molecules), as shown in FIG. 6b. Using the method of the present invention, host structures having intermolecular repeat distances (d) of from about 6.0 Å to about 8.5 Å and tilt angles ($\phi$) of from about 23° to about 32° have been synthesized with triacetylenes and successfully topochemically polymerized to form polytriacetylenes. The optimum repeat distance and tilt angle (determined by crystallographic examination to measure the percentage of co-crystal that is converted to polytriacetylene) has been found to be from about 7.0 Å to about 8.0 Å and from about 25° to about 29°, respectively.

The polytriacetylene formed using this method has the polytriacetylene chains lined up in parallel, imbedded in the hydrogen-bonded matrix of the host. The polytriacetylene can be separated from its host and any unreacted monomer by taking advantage of its acid base and solubility properties. In addition, the acidic properties of the polytriacetylene allow it to be converted into a soluble polyanion.

The application of the host-guest strategy to the topochemical polymerization of triacetylenes allows the preparation of a variety of polytriacetylene materials. The vinylogous amide is used for organizing the triacetylene functionality. The preferred hosts are diacids and diamines, which can be readily synthesized in one step from cyclohexadione and a suitable amine. Several new triacetylenes that are functionally suitable as guests can be prepared, including diacids and dipyridyls.

EXAMPLE 1

For this example, vinylogous amide was used as a host and triacetylene as a guest to prepare the crystal structure of a host-guest complex, which possesses the correct supramolecular structural parameters for a topochemical polymerization. After the host-guest co-crystal was formed, gamma radiation was used to produce topochemical polymerization. Previous experiments using heat and light to induce crystal to crystal polymerization were less effective and a lower percentage of the co-crystal was polymerized. The reaction shown in FIGS. 7a–d illustrates the topochemically-controlled polymerization of the triacetylene, which occurred in his example. Crystallographic examination of the polymers formed using gamma radiation showed that about 70% of the co-crystal containing triacetylene was polymerized to polytriacetylene.

EXAMPLE 2

Figure 8:
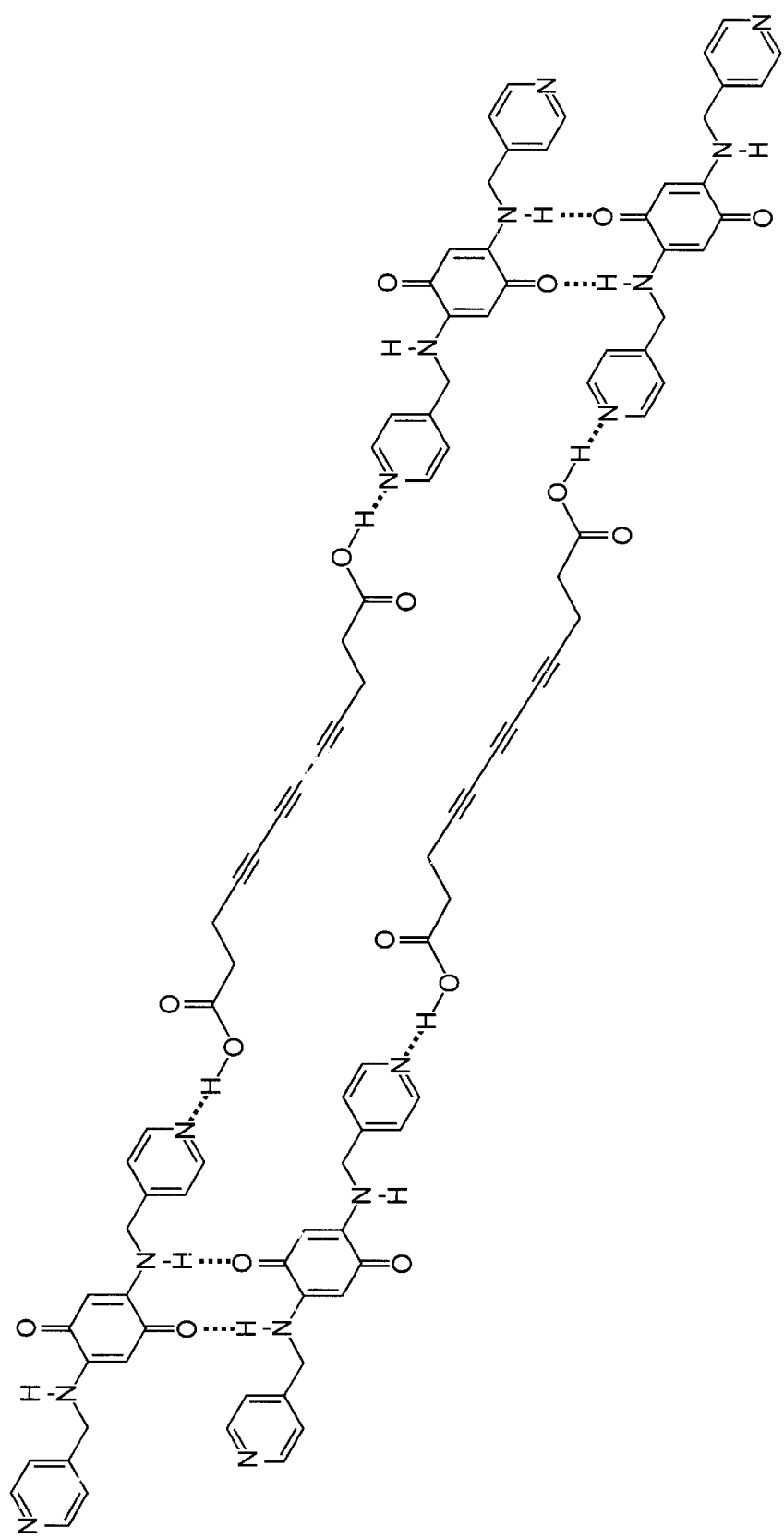
FIG. 8 shows the functional structure of the polytriacetylene formed by topochemical polymerization of the host-guest compound formed by an aminoquinone host molecule and a triacetylene guest molecule.

The vinylogous amide that was used in Example 1 had a molecular repeat distance (d) of about 7.2 Å. An examination of the test results indicated that a longer molecular repeat distance is more suitable for triacetylene polymerization. Therefore, for this example, aminoquinones with a molecular repeat distance (d) of about 7.6 Å (which is slightly greater than the vinylogous amide repeat distance) were used to prepare a co-crystal using the same procedure as Example 1. Suitable pyridine substituted aminoquinone was prepared and used to form co-crystals with the triacetylene. The quinone derivatives have the property of being oxidizing agents and are used to oxidize the polytriacetylene and produce an internally doped electrically conducting polymer. The functional structure of the co-crystal is shown in FIG. 8. Thus, although the primary function of the host is to provide structure, it can also be used to modify the properties of the functional guest molecule.

EXAMPLE 3

Figure 9:
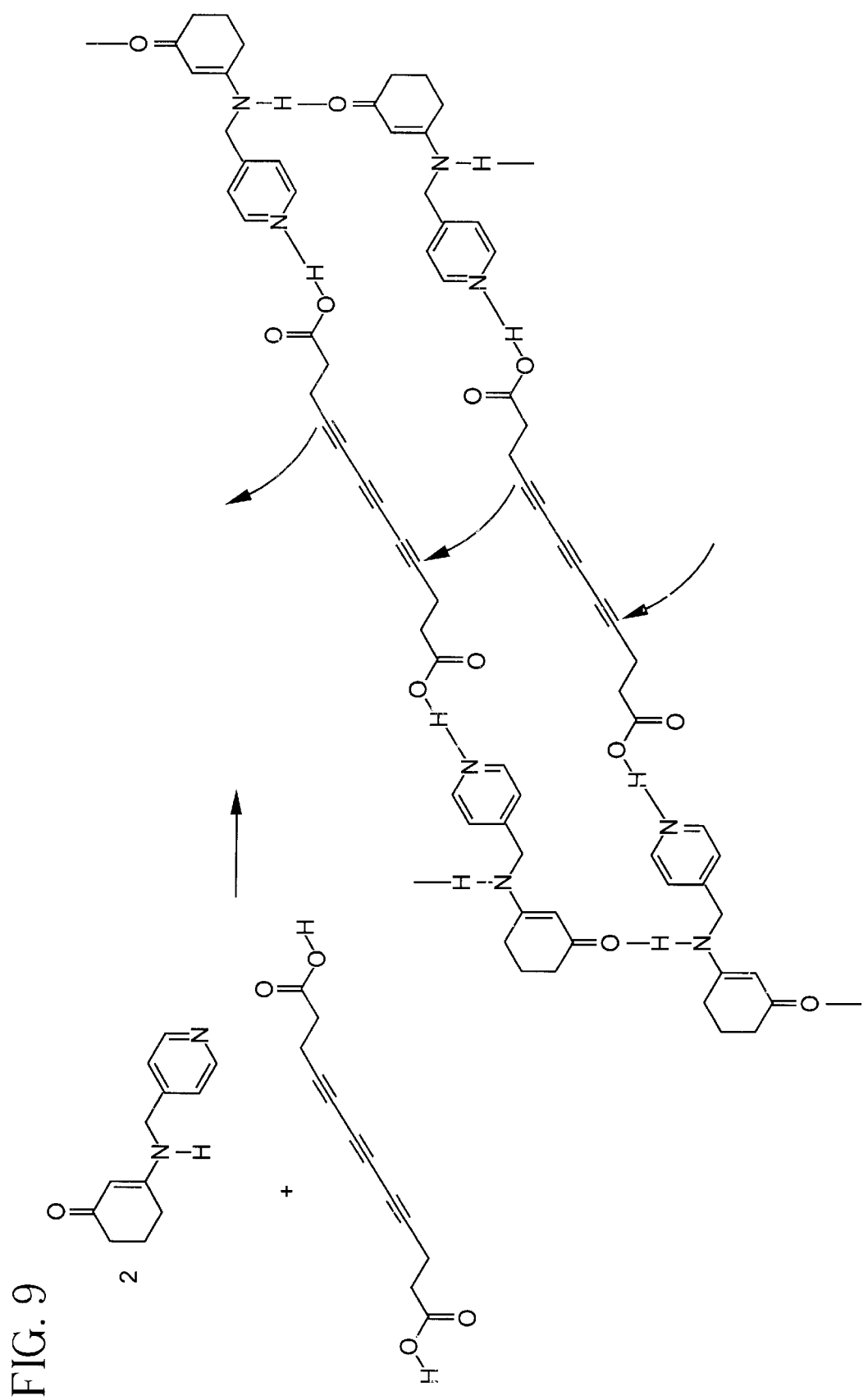
FIG. 9 shows the 1–6 polymerization of a vinylogous amide with a pyridine pendent group host molecule and a triacetylene dicarboxylic acid guest molecule.

In this example, a vinylogous amide with a pyridine pendent group was selected as the host molecule and a triacetylene dicarboxylic acid was selected as the guest molecule. The host and guest molecules were then synthesized to form a co-crystal having the supramolecular structural elements needed for the polymerization of a triacetylene to a polytriacetylene. The co-crystals were then subjected to γ-radiation to cause topochemical polymerization. The 1–6 polymerization took place as shown in FIG. 9. Crystallographic examination of the polymers formed using gamma radiation showed that about 70% of the co-crystal containing triacetylene was polymerized to polytriacetylene.

Thus, while there have been described the preferred embodiments of the present invention, those skilled in the art will realize that other embodiments can be made without departing from the spirit of the invention, and it is intended to include all such further modifications and changes as come within the true scope of the claims set forth herein.

We claim:

1. A method of preparing a conjugated polymer from a conjugated monomer that is not directly polymerizable, comprising:
   (a) complexing a stable host molecule and a guest conjugated monomer having greater than two unsaturated bonds to form a co-crystal, wherein said conjugated monomer is fixed such that when a plurality of said co-crystals are polymerized, reactive atoms of adjacent monomers are brought into near van der Waals contact to each other; and
   (b) polymerizing a plurality of said co-crystals to form a conjugated polymer; wherein the intermolecular repeat distance of the host molecule is from about 6.0 Å to about 8.5 Å.

2. The method of preparing a conjugated polymer of claim 1, further comprising determining a first intermolecular repeat distance and a first tilt angle relative to the translation axis for said guest conjugated monomer prior to complexing with said host molecule.

3. The method of preparing a conjugated polymer of claim 2, wherein said host molecule has a second intermolecular repeat distance and a second tilt angle relative to the translation axis, and wherein said first and said second repeat distances and said first and said second tilt angles are substantially equal.

4. The method of preparing a conjugated polymer of claim 1, wherein said co-crystals are polymerized using topochemical polymerization.

5. The method of preparing a conjugated polymer of claim 4, wherein said topochemical polymerization is carried out using gamma radiation.

6. The method of preparing a conjugated polymer of claim 1, wherein said conjugated monomer has greater than two unsaturated bonds.

7. The method of preparing a conjugated polymer of claim 1, wherein at least fifty percent of said co-crystals are converted to said conjugated polymer.

8. A method of preparing polytriacetylene comprising:
   (a) complexing a stable host molecule and a guest triacetylene molecule to a form co-crystal, wherein said triacetylene molecule is fixed such that when a plurality of said co-crystals are polymerized, reactive atoms of adjacent triacetylene molecules are brought into near van der Waals contact to each other; and
   (b) polymerizing a plurality of said co-crystals to form polytriacetylene.

9. The method of preparing polytriacetylene of claim 8, further comprising determining a first intermolecular repeat distance and a first tilt angle relative to the translation axis for said guest triacetylene molecule prior to complexing with said host molecule.

10. The method of preparing polytriacetylene of claim 9, wherein said host molecule has a second intermolecular repeat distance and a second tilt angle relative to the translation axis, and wherein said method further comprises selecting said host molecule so that said first and said second repeat distances and said first and said second tilt angles are substantially equal.

11. The method of preparing polytriacetylene of claim 8, wherein said co-crystals are polymerized using topochemical polymerization.

12. The method of preparing polytriacetylene of claim 11, wherein said topochemical polymerization is carried out using gamma radiation.

13. The method of preparing polytriacetylene of claim 8, wherein at least fifty percent of said co-crystals are converted to polytriacetylene.

14. The method of preparing a polytriacetylene of claim 10, wherein said second intermolecular repeat distance is from about 7.1 Å to about 7.6 Å and said second tilt angle is from about 23° to about 32°.

15. The method of preparing a polytriacetylene of claim 8, wherein said first intermolecular repeat distance is about 7.5 Å and said first tilt angle is about 27°.

16. The method of preparing a polytriacetylene of claim 8, wherein said van der Waals contact distance is about 3.5 Å.

17. The method of preparing a polytriacetylene of claim 8, wherein said host molecule is isocytocine, aminopyridone, vinylogous amide or diaminobenzoquinone.

18. The method of preparing a polytriacetylene of claim 8, wherein said reactive atoms of said adjacent triacetylene molecules are the $C_1$ and $C_6$ atoms.

19. A method of preparing polytriacetylene comprising:

(a) complexing a stable host molecule having an intermolecular repeat distance of from about 7.1 Å to about 7.6 Å and a tilt angle relative to the translation axis of from about 23° to about 32° and a guest triacetylene molecule to form a co-crystal, wherein said triacetylene molecule is fixed such that when a plurality of said co-crystals are polymerized, reactive atoms of adjacent triacetylene molecules are brought into near van der Waals contact to each other; and (b) topochemically polymerizing said co-crystals to form polytriacetylene.

20. The method of preparing polytriacetylene of claim 19, wherein said topochemical polymerization is carried out using gamma radiation.

21. The method of preparing polytriacetylene of claim 19, wherein at least fifty percent of said co-crystals are converted to polytriacetylene.

22. The method of preparing a polytriacetylene of claim 19, wherein said van der Waals contact distance is about 3.5 Å.

23. The method of preparing a polytriacetylene of claim 19, wherein said host molecule is isocytocine, aminopyridone, vinylogous amide or diaminobenzoquinone.

24. The method of preparing a polytriacetylene of claim 19, wherein said reactive atoms of said adjacent triacetylene molecules are the $C_1$ and $C_6$ atoms.

* * * * *